United States Patent [19]
Maeda

[11] Patent Number: 4,769,337
[45] Date of Patent: Sep. 6, 1988

[54] METHOD OF FORMING SELECTIVE POLYSILICON WIRING LAYER TO SOURCE, DRAIN AND EMITTER REGIONS BY IMPLANTATION THROUGH POLYSILICON LAYER

[75] Inventor: Takeo Maeda, Kawasaki, Japan

[73] Assignee: Kabushiki Kaisha Toshiba, Kawasaki, Japan

[21] Appl. No.: 47,146

[22] Filed: May 8, 1987

Related U.S. Application Data

[63] Continuation-in-part of Ser. No. 780,071, Sep. 25, 1985, Pat. No. 4,663,825.

[30] Foreign Application Priority Data

Sep. 27, 1984 [JP] Japan ............................. 59-202709
Sep. 27, 1984 [JP] Japan ............................. 59-202710
Nov. 30, 1984 [JP] Japan ............................. 59-253007

[51] Int. Cl.[4] .................... H01L 21/265; H01L 21/22
[52] U.S. Cl. ........................... 437/28; 148/DIG. 140; 357/91; 437/31; 437/34; 437/39; 437/46; 437/54; 437/186
[58] Field of Search ................ 437/28, 31, 34, 39, 437/54, 46, 186; 357/91

[56] References Cited

U.S. PATENT DOCUMENTS

| | | | |
|---|---|---|---|
| 4,346,512 | 8/1982 | Liang et al. | 437/31 |
| 4,403,395 | 9/1983 | Curran | 437/31 |
| 4,437,897 | 3/1984 | Kemlage | 437/31 |
| 4,484,388 | 11/1984 | Iwasaki | 437/31 |
| 4,525,922 | 7/1985 | Kiriseko | 437/39 |
| 4,534,806 | 8/1985 | Magdo | 437/31 |
| 4,640,721 | 2/1987 | Uehara et al. | 437/31 |

OTHER PUBLICATIONS

Hung et al., Appl. Phys. Lett. 43 (1983) 1123.
Van Ommen et al., Jour. Appl. Phys. 58 (1985) 4043.

*Primary Examiner*—Upendra Roy
*Attorney, Agent, or Firm*—Finnegan, Henderson, Farabow, Garrett & Dunner

[57] ABSTRACT

A method of manufacturing a semiconductor device, comprises the process of forming first and second well regions, which are of N-type and P-type, respectively, in a silicon body, forming a base layer of P-type in the first well region, forming an emitter layer of N-type in the base layer, forming source and drain layers of N-type in the second well region, forming a polysilicon emitter electrode on the emitter layer, and ion-implanting impurities of N-type into an interface between the emitter layer and the emitter electrode, so as to break down an insulative layer at the interface.

7 Claims, 3 Drawing Sheets

METHOD OF FORMING SELECTIVE POLYSILICON WIRING LAYER TO SOURCE, DRAIN AND EMITTER REGIONS BY IMPLANTATION THROUGH POLYSILICON LAYER

CROSS REFERENCE TO THE RELATED APPLICATION

This is a continuation-in-part of copending U.S. patent application Ser. No. 780,071 entitled "Method of Manufacturing Semiconductor Device", filed on Sept. 25, 1985, and issued on May 12, 1987, as U.S. Pat. No. 4,663,825.

BACKGROUND OF THE INVENTION

The present invention relates to a method of manufacturing a semiconductor device, which includes the step of connecting source and drain regions of an MIS semiconductor device to polysilicon wiring layers.

Multilayer wiring techniques have been recently employed to increase the packing density of semiconductor devices. Together with this, a new and improved MOS semiconductor device has been developed. This device has polysilicon wiring layers connected to its source and drain regions. A conventional MOS semiconductor device (e.g., an n-channel MOS semiconductor device) is manufactured as follows.

After a field oxide film as an element isolation region is formed in a major surface of a N-type silicon substrate to surround an island region, thermal oxidation is performed to form a gate oxide film on the island region. Subsequently, a polysilicon film as a gate electrode material is formed to cover the entire surface of the substrate and patterned to form a gate electrode. An n-type impurity, e.g., phosphorus is ion-implanted in part of the island region by using the field oxide film and the gate electrode as masks. The ion-implanted regions are activated to form N+-type source and drain regions. A CVD-SiO2 film as an insulating layer is formed on the major surface of the substrate, and contact holes are formed in the CVD-SiO2 film at positions corresponding to the source and drain regions. A poly-crystalline silicon (polysilicon) film is formed to cover the entire surface of the resultant structure. Phosphorus diffusion or ion implantation is performed in the polysilicon film, and annealing is then performed at a temperature of 950° C. or higher to thermally break down a natural oxide film formed at an interface between the N+-type source and drain regions and the polysilicon film, thereby establishing an ohmic contact therebetween. Thereafter, the polysilicon film is patterned to form source and drain electrodes electrically connected to the source and drain regions, respectively.

In the conventional MOS semiconductor device, the source and drain regions must be shallow to increase the packing density. For this purpose, low temperature annealing is performed to form the source and drain regions, thereby preventing the impurity from redistribution. For this reason, unlike in the conventional technique, high temperature annealing cannot be performed. As a result, the natural oxide film formed at the interface between the source and drain regions and the polysilicon film cannot be sufficiently broken down. Therefore, no ohmic contact can be established between the source and drain regions and the polysilicon wiring layer.

SUMMARY OF THE INVENTION

It is an object of the present invention to provide a method of manufacturing a highly integrated high-speed semiconductor device, wherein a good ohmic contact can be established between a polysilicon or monocrystalline silicon conductive region and a polysilicon wiring layer even if low temperature annealing for shallow source and drain regions is performed.

DETAILED DESCRIPTION OF THE PREFERRED EMBODIMENTS

The semiconductor device-manufacturing method according to the first embodiment will be described with reference to FIGS. 1A to 1E.

Figure 1A:
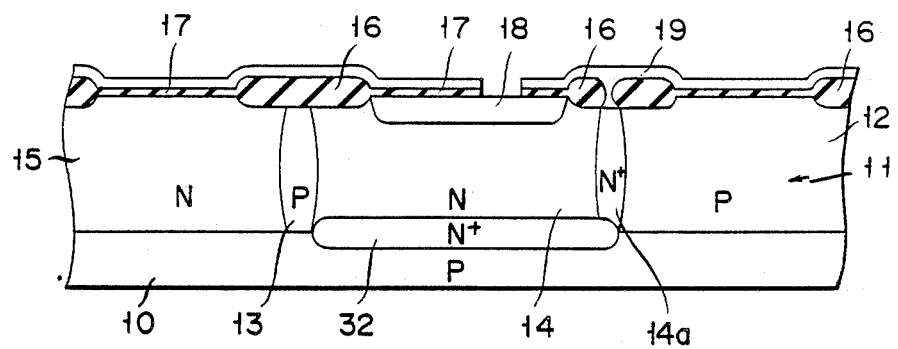
FIGS. 1A to 1E are respectively sectional views for explaining the steps in manufacturing a semiconductor device according to a first embodiment of the present invention.

N-type epitaxial layer 11 is formed on P-type silicon crystalline substrate 10 of an impurity concentration of $5 \times 10^{15}/cm^3$. P-type impurities, such as boron and N-type impurities such as phosphor, are diffused in selected parts of epitaxial layer 11, thereby forming P-type well region 12, N-type well region 15 and P-type isolation region 13, respectively. These regions 12, 13, 15 are formed such that they have an impurity concentration of $2 \times 10^{16} \sim 8 \times 10^{16}/cm^3$. Consequently, epitaxial layer 11 includes first and second N-type well regions 14 and 15, in addition to P-type well region 12. First N-type well region 14 is adjacent to P-type well region 12, and second N-type well region 15 is separated from region 14 by isolation region 13. When forming epitaxial layer 11, antimony is introduced into that portion of substrate 10 on which N-type well region 14 is to be grown, thereby allowing n+ region 32 with an impurity concentiation of $5 \times 10^{19}/cm^3$ to be formed between first N-type well region 14 and substrate 10 at the time of epitaxial growth. Field oxide film 16 is formed on the major surface of the resultant semiconductor body (i.e., on the upper side of epitaxial layer 11), except for the central portions of regions 12, 14 and 15. Phosphor is ion-implanted between P- and N-type well regions 12, 14 through field oxide film under the condition of 60 KeV, and $1 \times 10^{16}/cm^3$ to form N+-type region 14a. Gate oxide film 17 with a thickness of 150 Å is formed on these central portions, i.e., the portions of epitaxial layer 11 which remain exposed. Next, boron is ion-implanted into first N-type well region 14 through gate oxide film 17 by use of a predetermined mask, thereby forming P-type base layer 18 on the upper side of first N-type well region 14. The amount of ions to be introduced into first N-type well region 14 is controlled such that base layer 18 has an impurity concentration of $1 \times 10^{18}/cm^3$. Thereafter, first polysilicon film 19 of a $1000 \sim 1500$ Å A thickness is formed on both field oxide film 16 and gate oxide film 17, using the CVD method. That part of gate oxide film 17 which is located above first N-type well region 14 and the corresponding part of polysilicon film 19 are removed by selective etching, so as to form an emitter opening that exposes part of base layer 18 (FIG. 1A).

Second polysilicon film 20 of a 500~700 Å thickness is formed on first polysilicon film 19 and on that portion of base layer 18 which is exposed through the emitter opening, by using the CVD method. Next, arsenic is introduced into base layer 18 through second polysilicon layer 20, thereby forming N-type emitter layer 21. By this ion-implantation of arsenic the specific resistance of second polysilicon film 20 is reduced, and, simultaneously, a thin insulation layer which may be formed between emitter layer 21 and second polysilicon film 20 is broken down. The impurities used for these purposes are not limited to arsenic; other impurities may be used as long as they are of the same conductivity type as emitter layer 21. The impurities used for breaking down the insulation layer also enter emitter layer 21, so that the final impurity concentration of emitter layer 21 is $0.5 \sim 1 \times 10^{21}/cm^3$. In this embodiment, the ion-implantation of arsenic is carried out with a concentration of $5 \times 10^{15}/cm^2$, by use of an accelerating voltage of 60 KeV. In order to reliably break down the insulation layer without adversely affecting the other portions, it is preferable that the impurity concentration is within the range of $5 \times 10^{15}$ to $2 \times 10^{16}/cm^2$.

Figure 1B:
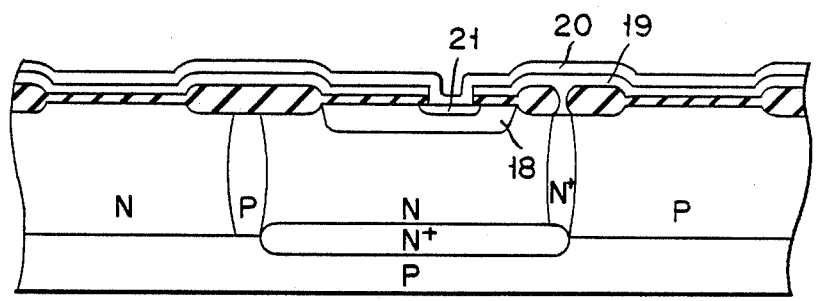

Next, the resultant semiconductor body is thermally treated for 5~30 seconds at a temperature of 1,000° C.-1,150° C., so as to activate the ion-implanted layers (FIG. 1B). Before this heating step, an oxide film may be provided on polysilicon film 20 to prevent the outer diffusion of arsenic through the film 20.

Figure 1C:
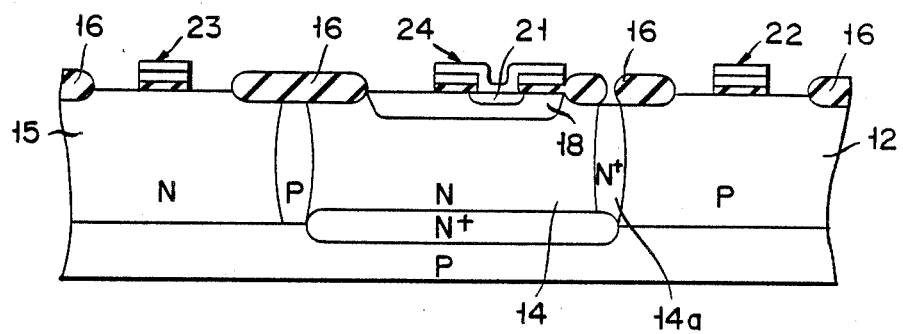

The composite film, including gate oxide film 17 and first and second polysilicon films 19 and 20, is removed by selective etching in such a manner that it remains only at the following locations: in the center of the upper side of p-type well region 12; in the center of the upper side of second n-type well region 15; and on emitter layer above first n-type well region and on that portion of base layer 18 which is located in the vicinity of emitter layer 21. The composite films remaining at these locations will be indicated by 22, 23 and 24, respectively (FIG. 1C).

N-type impurities, such as arsenic, are ion-implanted into p-type well region 12, using composite film 22 and field oxide film 16 as masks, thereby forming N-type source and drain layers 25 and 26. The source and drain layers 25, 26 may be formed to have an N⁻-type region and N⁺-type region by a connectional lightly doped drain (LDD) method. As a result an N-channel MOS-FET, the gate electrode of which is constituted by the polysilicon films of composite film 22, is formed in P-type well region 12.

Figure 1D:
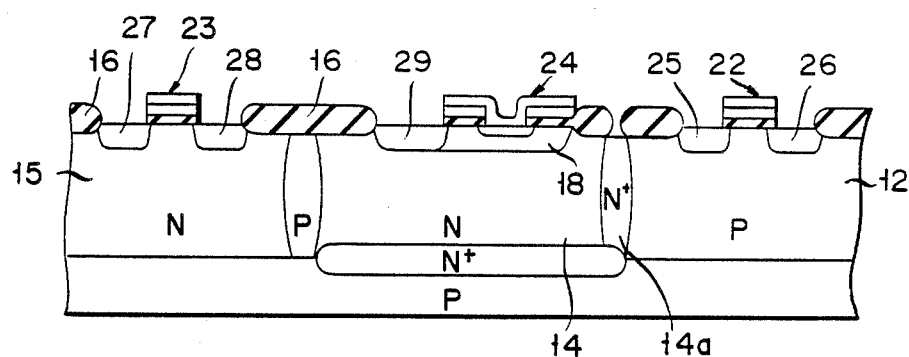

Next, P-type impurities, such as BF₂, are ion-implanted into second N-type well region 15, using composite film 23 and field oxide film 16 as masks, thereby forming P-type source and drain layers 27 and 28. As a result, a P-channel MOS-FET, the gate electrode of which is constituted by the polysilicon films of composite film 23, is formed in second N-type well region 15. The P-type impurities are also ion-implanted into first N-type well region 14, using field oxide film 16 and composite film 24 as masks. After this ion-implantation, P⁺-layer 29, to which an electrode is attached, is formed in base layer 18 (FIG. 1D). The ion-implantation for forming P⁺-layer 29 may be carried out when the ion-implantation for forming P-type source and drain layers 27 and 28 is being performed. Alternatively, it may be carried out before or after the ion-implantation.

The ion-implantation of n-type impurities need not precede the ion-implantation of p-type impurities. The former ion-implantation may be carried out after the latter.

Figure 1E:
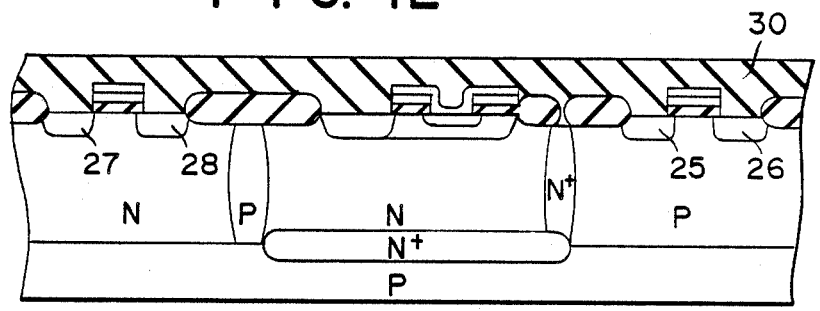

The upper side of the resultant semiconductor body is entirely covered with silicon oxide film 30 (FIG. 1E).

The semiconductor body is then processed by conventional techniques, to obtain a semiconductor device. Specifically, contact holes are formed at predetermined locations of silicon oxide film 30, and a conductive material, such as aluminum, is deposited into the contact holes and on silicon oxide film 30. By patterning the conductive material, electrodes are formed, thus obtaining the semiconductor device.

The method according to the second embodiment will be described with reference to FIGS. 2A to 2C.

The semiconductor device manufactured by the method of the second embodiment has similar portions to those in the first embodiment. Similar portions will be indicated by the same reference numerals, and a detailed description thereof will be omitted.

Figure 2A:
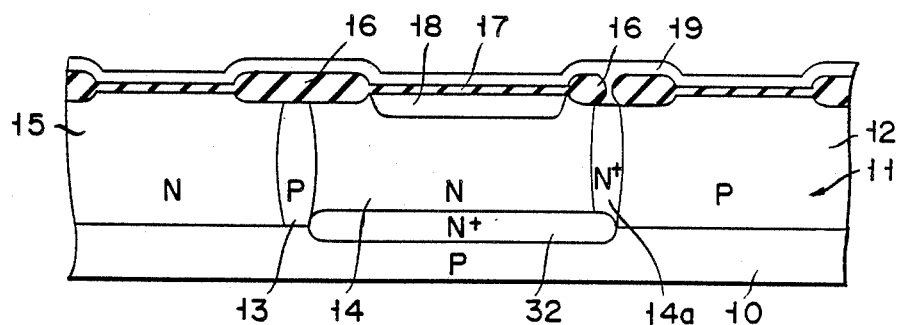
FIGS. 2A to 2C are respectively sectional views for explaining the steps in manufacturing a semiconductor device according to a second embodiment of the present invention.
Figure 2B:
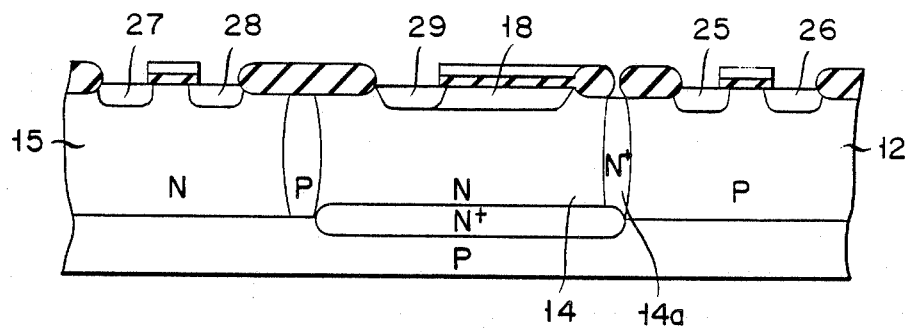
Figure 2C:
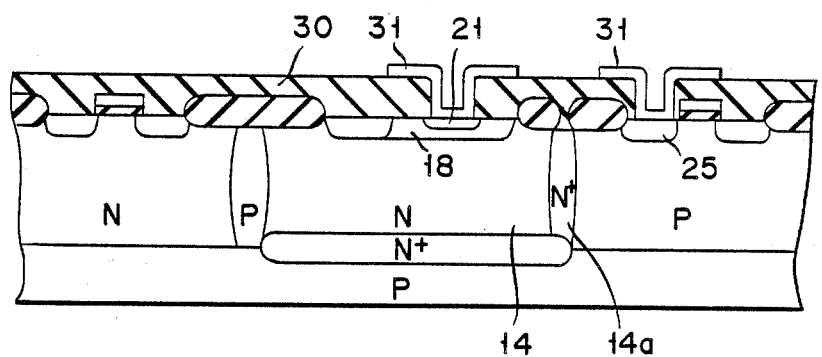

As can be seen from FIG. 2A, the method of the second embodiment is similar to that of the first embodiment until the step of forming first polysilicon film 19 on both field oxide film 16 and gate oxide film 17. Therefore, only the steps following this step will be described.

In the second embodiment, polysilicon film 19 and gate oxide film 17 constitute a composite film. The portions of this composite film which are located on the upper sides of P-type well region 12 and second N-type well region 15 are removed by selective etching in such a manner that the composite film remains only in the centers of these regions 12 and 15. That portion of the composite film which is located on the upper side of first N-type well region 14 is removed such that base layer 18 is exposed in part. Thereafter, N-type impurities are ion-implanted into the exposed portions of P-type well region 12, thereby forming N-type source and drain layers 25 and 26. Likewise, P-type impurities are ion-implanted selectively into the exposed portions of second N-type well region 15 and into the exposed portion of first N-type well region 14, thereby forming P-type source and drain layers 27 and 28 in second N-type well region 15 and forming P⁺-layer 29 in base layer 18. (FIG. 2B) As a result, an N-channel MOS-FET is formed in P-type well region 12, and a P-type MOS-FET is formed in second N-type well region 15. The ion-implantation of the P-type impurities and that of the N-type impurities need not be performed in the order mentioned; they may be performed in an arbitrary order. Further, the regions into which the impurities are ion-implanted need not be exposed beforehand. In other words, the ion-implantation may be carried out without removing the gate insulation film.

Next, the composite film remaining on first N-type well region 14 is removed, and then the upper side of the resultant semiconductor body is entirely covered with silicon oxide film 30. A contact hole is formed in those portions of silicon oxide film 30 which are located above activating layers. (In FIG. 2C, such a contact hole is located above base layer 18 and above N-type source layer 25.) Polysilicon film 31 is formed on silicon oxide film 30 and in the contact holes. Polysilicon film 31 is patterned such that at least the portions around the contact holes remain. By ion-implanting n-type impurities into the interface between the semiconductor body and the portions of polysilicon film 31 which are located in the contact holes, the insulating film at the interface is broken down. Thereafter, the resultant structure is subjected to thermal treatment, whereby emitter layer 21 is formed in base layer 18 by use of the n-type impurities that are ion-implanted. As a result, an emitter electrode and a source electrode for the n-channel MOS-FET are formed by polysilicon film 31. Incidentally, the ion-implantation of the n-type impurities may be carried out after patterning polysilicon film 31.

The emitter layer may be formed by carrying out ion implantation of impurities. This ion-implantation may be performed before the ion-implantation process for breaking down the insulation film. Alternatively, it may be performed simultaneously when the ion-implantation for breaking down the insulating layer is being carried out.

What is claimed is:

1. A method of manufacturing a semiconductor device, comprising the processes of:
   forming first and second well regions, which are of first and second conductivity types, respectively, in a semiconductor body;
   forming a base layer of the second conductivity type in the first well region;
   forming an emitter layer of the first conductivity type in the base layer;
   forming source and drain layers of the first conductivity type in the second well region;
   forming a polysilicon emitter electrode on the emitter layer; and
   ion-implanting impurities of the first conductivity type into an interface between the emitter layer and the emitter electrode, so as to break down an insulative layer at the interface.

2. A method of manufacturing a semiconductor device according to claim 1, further comprising the processes of:
   forming a third well region of the first conductivity type in the semiconductor body such that the third well region is isolated from the first well region by an isolating layer of the second conductivity type; and
   forming source and drain layers of the second conductivity type in the third well region.

3. A method of manufacturing a semiconductor device, comprising the processes of:
   forming first and second well regions, which are of first and second conductivity types, respectively, in a semiconductor body;
   forming a gate insulation film on one side of each of the first and second well regions;
   forming a base layer of the second conductivity type on one side of the first well region;
   forming a contact hole in that part of the gate insulation film which is located on the base layer, thereby exposing part of the base layer;
   forming a polysilicon film on the gate insulation film and on an exposed part of the base layer;
   forming an emitter layer by introducing impurities of the first conductivity type into the base layer through the polysilicon film located on the exposed part of the base layer;
   ion-implanting impurities of the first conductivity type into an interface between the polysilicon film and the emitter layer, thereby breaking down an insulating film at the interface;
   removing a composite film, which includes the gate insulating film and the polysilicon film located on the second well region, such that the composite film remains in part on the second well region;
   ion-implanting impurities of the first conductivity type into the second well region, using the remaining composite film as a mask, thereby forming source and drain layers; and
   covering one side of the well regions with an insulating film 4. A method of manufacturing a semiconductor device according to claim 3, wherein the process of forming the emitter layer includes a step of ion-implanting impurities of the first conductivity type into the base layer through the polysilicon film.

5. A method of manufacturing a semiconductor device according to claim 3, further comprising the processes of:
   forming a third well region of the first conductivity type in the semiconductor body such that the third well region is isolated from the first well region by an isolating layer of the second conductivity type; and
   ion-implanting impurities of the second conductivity type into the first and third well regions, thereby simultaneously forming both a high-concentration impurity layer in the base layer of the first well region and source and drain layers in the third well region.

6. A method of manufacturing a semiconductor device, comprising the processes of:
   forming first and second well regions, which are of first and second conductivity types, respectively, in a semiconductor body;
   forming a gate insulation film on one side of each of the first and second well regions;
   forming a base layer of the second conductivity type on one side of the first well region;
   forming a polysilicon film on the gate insulation removing a composite film, which includes the gate insulation film and the polysilicon film located on the second well region, such that the composite film remains in part on the second well region;
   introducing impurities of the first conductivity type into the second well region, using the remaining composite film as a mask, thereby forming source and drain layers;
   covering one side of the semiconductor body with an insulating film;
   forming a contact hole in those portions of the insulating film which are located on the base and source layers;
   forming an emitter layer of the first cond.uctivity type in the source layer located in the contact hole;
   covering portions exposed by the contact holes with a polysilicon film; and
   ion-implanting impurities of the first conductivity type into an interface between the portions exposed by the contact holes and the polysilicon film, thereby breaking down an insulating layer at the interface.

7. A method of manufacturing a semiconductor device according to claim 6, wherein the process of forming the emitter layer is performed before or after the insulating layer at the interface is broken down, or during the insulating layer is being broken down.

* * * * *